United States Patent [19]
Perry et al.

[11] Patent Number: 5,910,219
[45] Date of Patent: Jun. 8, 1999

[54] CAN COATING SYSTEM

[75] Inventors: Terry T. Perry, Buxton, Me.; Krishnangshu Bose, Manchester, Conn.; David W LaFlamme, Colchester, Conn.; Lester J Magyar, Wallingford, Conn.

[73] Assignee: United Technologies Corporation, Hartford, Conn.

[21] Appl. No.: 08/870,805

[22] Filed: Jun. 6, 1997

[51] Int. Cl.$^6$ ................................................ C23C 16/00
[52] U.S. Cl. .............................................. 118/719; 118/726
[58] Field of Search ..................................... 118/719, 726

[56] References Cited

U.S. PATENT DOCUMENTS 5,308,399  5/1994  Pillhoefer ................................ 118/726
5,439,525  8/1995  Peichl .................................... 118/726

Primary Examiner—Richard Bueker
Attorney, Agent, or Firm—Bachman & LaPointe, P.C.

[57] ABSTRACT

A coating apparatus is provided which comprises a can defining an internal chamber. A hollow sleeve which itself defines an internal space is located within the chamber. The hollow sleeve defines with the can an annular space. A plurality of perforations are located in the wall of the hollow sleeve for communicating the annular space with the internal space defined by the sleeve. A lid for enclosing the can and the hollow sleeve is secured to the can for forming a closed compartment.

8 Claims, 1 Drawing Sheet

CAN COATING SYSTEM

BACKGROUND OF THE INVENTION

The present invention relates to a process for coating an airfoil to protect it against oxidation and corrosion during operation and to a particular apparatus for use in chemical vapor deposition processes to form an oxidation and corrosion resistant coating on external and internal surfaces of said airfoil.

Aluminide coatings are applied on nickel-based superalloy turbine airfoils to protect the airfoils against oxidation and corrosion during operation in the turbine section of engines. These coatings are formed by the deposition of aluminum onto the surfaces of the airfoils. A reaction occurs between the nickel in the airfoil material and the deposited aluminum to form nickel-based aluminides. At high temperatures, in the presence of air, the aluminum in the nickel aluminide coating forms a thin, adherent aluminum oxide at the surface of the coating. This aluminum oxide provides a barrier against further oxidation and corrosion of the turbine airfoil. The external surfaces of turbine airfoils in most engines are coated with aluminides. The performance requirements of the engines determine whether aluminide coatings also are required on the internal surfaces of the airfoils.

Currently, there are two processes used in the prior art to internally coat airfoils. One process employs a slurry technique and is used for airfoils that operate in the low pressure turbine section of an engine. The second process uses chemical vapor deposition to coat the internal surfaces of the airfoils for the high pressure turbine section of an engine. Different coating processes are employed for the two different types of airfoils because the high pressure turbine section of an engine operates at a higher temperature and pressure than the low pressure turbine section of an engine. As a result, the coating applied to high pressure turbine airfoils must have higher temperature capacity and must be more robust than those applied to low pressure turbine airfoils.

U.S. Pat. No. 5,366,765 to Milaniak et al. describes a slurry technique for coating internal passages in low pressure turbine airfoils. The slurry described in this patent cannot be used to coat the internal passages of high pressure turbine airfoils for the following reasons:

(1) the slurry produces a coating that is too brittle;
(2) the coating is too thick to apply to the internal cooling passages of high pressure turbine airfoils; and
(3) it is not compatible with the processes used to coat the external surfaces of airfoils.

Chemical vapor deposition processes used to coat airfoils employ an apparatus known as a coat boat as generally shown in FIG. 1. During the coating process, turbine airfoils 10 are placed in an upright position within a compartmentalized, large metal box or coating fixture 12, called a coat boat. The figure illustrates a typical coat box arrangement. To coat the internal passages of the airfoils 10, chemicals 14 are placed in a compartment 16 below the airfoils. The airfoils are mounted on specialized plumbing tools 18 that allow vapors to flow through the internal cooling passages of the airfoils. Argon gas is introduced into the lower compartment 16 via inlet 20 to force the coating vapors through the internal areas of the airfoils. These vapors react with the internal surfaces of the airfoil to produce an aluminide coating. At the same, chemicals 14 in an upper compartment 22 create vapors which react with the external surfaces of the airfoil to form an aluminide coating thereon. There are problems however associated with this coat boat process. The problems include (1) the large coat boat which is heavy and ergonomically unsafe to handle, (2) excessive time to coat airfoils due to the large volume of the coat boat, and (3) a fixed capacity due to the fact that the process is a batch process.

Thus, there remains a need for an apparatus and a coating process which eliminates the problems associated with employment of a coat boat in the chemical vapor deposition processes currently employed. There is also a need for an apparatus and a coating process which allows the external and internal surfaces of an airfoil to be coated during a single cycle.

SUMMARY OF THE INVENTION

Accordingly, it is an object of the present invention to provide an apparatus for use in chemical vapor deposition processes for forming a corrosion and oxidation resistant coatings on the surfaces of airfoils.

It is a further object of the present invention to provide an apparatus and process as above which produces coatings of desired thickness and allows the internal surfaces of an airfoil to be coated simultaneously with the external surfaces of the airfoil.

It is yet a further object of the present invention to provide an apparatus and a process which is ergonomically acceptable, reduces coating time and cost, increases coating capacity and the flexibility of single piece coating.

The foregoing objects are attained by the coating composition and the coating process of the present invention.

In accordance with the present invention, a coating apparatus is provided which comprises a can defining an internal chamber. A hollow sleeve which itself defines an internal space is located within the chamber. The hollow sleeve defines with the can an annular space. A plurality of perforations are located in the wall of the hollow sleeve for communicating the annular space with the internal space defined by the sleeve. A lid for enclosing the can and the hollow sleeve is secured to the can for forming a closed compartment.

In accordance with a preferred embodiment of the present invention the lid includes a slot for supporting a workpiece in the form of an airfoil within the internal space defined by the hollow sleeve. The perforations in the hollow sleeve are sized so as to provide sufficient communication of chemical vapors from the annular space to the internal space so as to coat the airfoil by chemical vapor deposition during the coating process. The perforations are preferably sized between about 0.05 to 0.20 inches in diameter.

In accordance with the process of the present invention a chemical coating composition is located in the annular space between the can and the hollow sleeve. An activator is located within the internal space defined by the hollow sleeve below the airfoil. The can which is sealed by the lid is then heated for sufficient time and temperature so as to affect chemical vapor deposition of the coating chemical composition on the airfoil.

Further details of the apparatus and the process of the present invention, as well as further objects and advantages, are set forth in the following detailed description and the accompanying drawings wherein like reference numerals depict like elements.

DETAILED DESCRIPTION OF THE PREFERRED EMBODIMENT(S)

The present invention is drawn to an apparatus and a process for coating an airfoil to protect it against oxidation and corrosion during operation. The primary purpose for the apparatus of the present invention is for uses in chemical vapor deposition processes to form an oxidation and corrosion resistant coating on external and internal surfaces of an airfoil.

Figure 1:
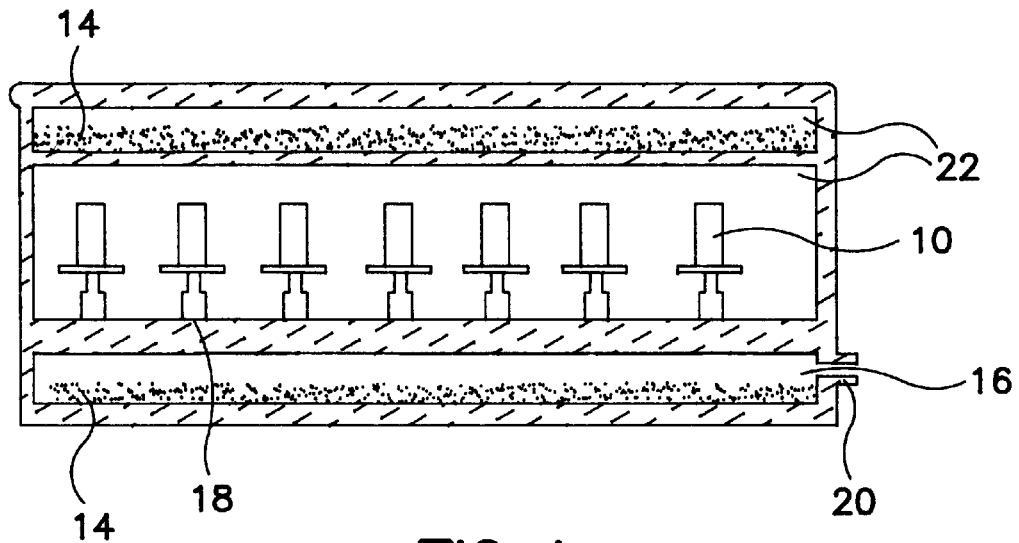
FIG. 1 illustrates a prior art coating fixture for coating internal and external surfaces of an airfoil.
Figure 2:
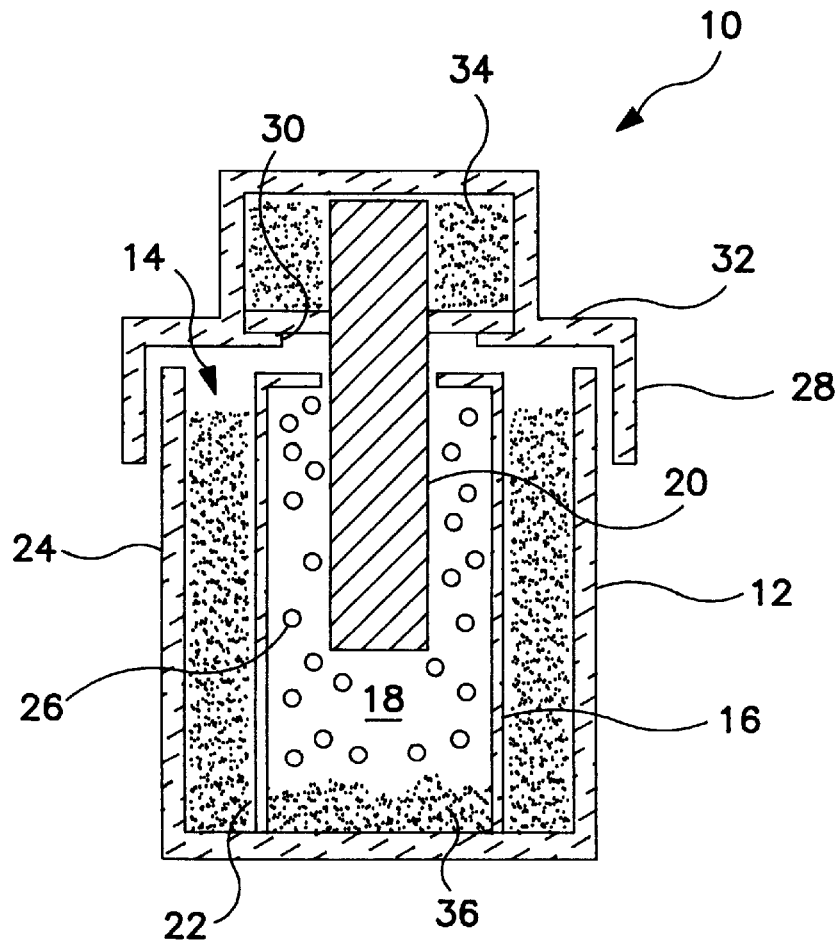
FIG. 2 illustrates an apparatus in accordance with the present invention for coating internal and external surfaces of an airfoil.

With reference to FIG. 2, the apparatus of the present invention will be described. The apparatus 10 comprises a can 12 which defines a chamber 14. Located within the can 12 in the chamber 14 is a hollow sleeve 16 which itself defines an internal space 18 for receiving a workpiece or airfoil 20 in a manner to be described hereinbelow.

The hollow sleeve 16 defines with the can 12 an annular space 22 between the hollow sleeve and the can. The size of the annular space 22 is such that it is sufficient in volume to contain a required amount of a chemical coating composition 24 which is necessary for the chemical vapor deposition process to be described hereinbelow. In accordance with the present invention it has been found useful to space the hollow sleeve from the can a substantially uniform distance of about between 0.25 to 0.75 inches. Generally the dimensions of the can and sleeve are determined as a function of the size of the workpiece being coated. It should be appreciated that the space of sleeve 16 is preferably cylindrical; however, different shaped sleeves may be provided for special coating applications. For example, a conical sleeve which would vary the shape of the annular space may be needed for increasing coating thickness preferentially.

In accordance with the particular feature of the present invention the hollow sleeve is provided with a plurality of perforations 26 for communicating the annular space 24 with the internal space 18. The size of the perforations and the total volume of the perforations are such as to provide sufficient communication of the chemical vapor generated during the process of the present invention as described hereinbelow from the annular space 24 to the internal space 18 so as to provide for coating of the airfoil 20. The perforations are preferably sized between about 0.05 to 0.20 inches in diameter.

The coating of the apparatus of the present invention includes a lid 28 which is adaptedly secured to the can 12 for closing off the internal spaces of the can from atmosphere. The lid 28 is provided with a slot 30 defined by shoulders 32 which support the root portion of the airfoil in a manner to allow the portion of the airfoil being coated to be held within inner space 18. A masking chamber 34 is also provided in the lid for masking those portions of the airfoil which are not to be coated.

In order to carry out the chemical vapor deposition process, an activator is located inside the can and it is preferred to provide the activator 36 in the internal space 18 below the airfoil 20. The activator could, however, be provided anywhere within the can including annular space 24.

In accordance with the process of the present invention a chemical coating composition 26 is provided in annular space 24. A suitable chemical coating composition is CrAl. It is preferred in the process of the present invention to provide an activator within the internal space 18. A suitable activator is $AlF_3$. The ratio of CrAl to $AlF_3$ is preferably between about 8:1 to 12:1 and ideally about 10:1. The amount of the chemical coating composition and activator is dependent on the volume of the can and is generally between about 1.00 to 3.25 grams per cubic inch of can volume. Once the lid 28 is located on the can 12 with the activator and chemical coating composition in place, the can is then heated to the desired temperature for sufficient time to carry out the chemical vapor deposition process and coat the surfaces of the airfoil. Typical heating step comprises applying a temperature in the range of from about 1950° F. to about 2050° F. for a time period of between 4 to 17 hours.

It has been found that the apparatus and process of the present invention offers significant advantages over the processes carried out in the coat boats of the prior art. Firstly, furnace capacity allows for a greater number of airfoils to be coated in the apparatus of the present invention than in coat boats. For example, a maximum of 12 coat boats can be used in typical coating furnaces with each coat boat having from 10 to 14 airfoils. Thus, one furnace cycle is limited to between 120 to 180 airfoils. It has been found that when coating airfoils, over 200 cans may be placed in the coating furnaces thereby allowing up to 200 airfoils to be coated in one furnace cycle. In addition, the apparatus of the present invention allows for coating of single pieces in an economical manner which cannot be achieved by the current coat boat apparatus. Secondly, the small size and weight of the apparatus leads to improved ergonomics and ease of handling. Thirdly, the coating cycle is significantly shortened with the apparatus of the present invention. Finally, and most importantly, the amount of activator necessary for effective coating is reduced which is beneficial in light of the cost and environmental problems associated with the activator.

Further advantages will be made clear from a consideration of the following examples.

EXAMPLE

In order to demonstrate the viability of the apparatus and process of the present invention, three different type airfoils were coated and compared to similar airfoils coated in and by the conventional coat boat process.

In the first trial JT9D first stage airfoils were coated. A conventional coat boat measuring 19 inches by 10 inches by 13 inches deep was loaded with twelve (12) airfoils. A chemical composition comprising 880 grams of CrAl and 160 grams of activator $AlF_3$ was loaded into the coat boat. Twelve can and sleeve apparatus of the present invention were loaded with a single airfoil, 100 grams of CrAl and 10 grams of $AlF_3$. The coat boat and can were placed in a furnace and heated to a temperature of 1975° F. and held there for four hours to carry out CVD. The coating thickness of each of the airfoils was measured. The results are set forth in Table I and compared with commercial requirements.

TABLE I

| JT9D 1st stage blades | Coating Thickness (inches) Average | Coat Time and Temperature |
|---|---|---|
| Requirements | 0.0005 to 0.0025 | |
| Can and Sleeve Process Trials | 0.0019 to 0.0024 | 4 hrs @ 1975° F. |
| Current Coat Boat Process | 0.0017 to 0.0023 | 4 hrs @ 1975° F. |

As can be seen from the foregoing, all specimens met commercial requirements. The airfoils coated in accordance with the present invention achieved coating thicknesses comparable to the coat boat process while employing less activator, that is, 120 grams as compared to 180 grams.

Two further trails were run as above on F100 first stage airfoils and F100 second stage airfoils. The amounts of chemical coating composition and activator employed were the same as in Trial 1 above. The coating times varied as indicated below in Table II and Table III.

TABLE II

| F100 1st stage blades | Coating Thickness (inches) Average | Coat Time and Temperature |
|---|---|---|
| Requirements | 0.0020 to 0.0040 | |
| Can and Sleeve Process Trials | 0.0023 to 0.0025 | 6.5 hrs @ 1975° F. |
| Current Coat Boat Process | 0.0021 to 0.0027 | 10 hrs @ 1975° F. |

TABLE III

| F100 2nd stage blades | Coating Thickness (inches) Average | Coat Time and Temperature |
|---|---|---|
| Requirements | 0.0015 to 0.0030 | |
| Can and Sleeve Process Trials | 0.0024 to 0.0025 | 4 hrs @ 1975° F. |
| Current Coat Boat Process | 0.0020 to 0.0023 | 6.5 hrs @ 1975° F. |

As can be seen from Tables II and III, coating employing the process and apparatus of the present invention resulted in acceptable airfoils in less time and employing less activator. The result is substantial cost savings and flexibility in the coating process.

Although this invention has been shown and described with respect to detailed embodiments thereof, it will be understood by those skilled in the art the various changes, omissions, and additions in form and detail thereof may be made without departing from the spirit and scope of the claimed invention.

What is claimed is:

1. A coating apparatus comprising:

a can defining a chamber;

a hollow sleeve defining an internal space located within said chamber, said hollow sleeve defines with said can an annular space;

passage means located in said hollow sleeve for communicating said annular space with said internal space;

lid means for enclosing said can and said hollow sleeve for forming a closed compartment; and support means for supporting a workpiece at least partially within said internal space wherein said activator is located within said internal space below said workpiece.

2. An apparatus according to claim 1 wherein said lid means includes support means for supporting a workpiece at least partially within said internal space.

3. An apparatus according to claim 2 wherein said workpiece is an airfoil.

4. An apparatus according to claim 2 wherein said passage means comprises a plurality of perforations having a size of between about 0.05 to 0.20 inches in diameter.

5. An apparatus according to claim 3 wherein said support means comprises a slot.

6. An apparatus according to claim 1 wherein said hollow sleeve is spaced substantially uniformly a distance of between about 0.25 to 0.75 inches from said can so as to define said annular space.

7. An apparats according to claim 5 wherein said airfoil has a platform section and a root section held by said support means within said lid means.

8. An apparatus according to claim 2 wherein a chemical coating composition is located within said annular space.

* * * * *